United States Patent [19]

Sakemi

[11] Patent Number: 5,666,721
[45] Date of Patent: Sep. 16, 1997

[54] METHOD OF SOLDERING AN ELECTRONIC CONNECTOR ON A PRINTED CIRCUIT BOARD

[75] Inventor: Shoji Sakemi, Fukuoka, Japan

[73] Assignee: Matsushita Electric Industrial Co., Ltd., Osaka, Japan

[21] Appl. No.: 373,785

[22] Filed: Jan. 17, 1995

[30] Foreign Application Priority Data

Jan. 18, 1994 [JP] Japan .................................. 6-003470
Nov. 15, 1994 [JP] Japan .................................. 6-280570

[51] Int. Cl.⁶ .................................................. H01R 9/00
[52] U.S. Cl. ........................ 29/843; 228/180.21; 439/79
[58] Field of Search ............................ 29/840, 843, 860; 228/180.21; 361/785, 787, 789

[56] References Cited

U.S. PATENT DOCUMENTS 4,132,341  1/1979  Bratschun ................ 228/180.21
5,277,596  1/1994  Dixon ............................. 29/843
5,373,984  12/1994 Wentworth ................ 228/180.21
5,441,429  8/1995  Seidler ............................ 29/843

*Primary Examiner*—P. W. Echols
*Assistant Examiner*—Adrian L. Coley
*Attorney, Agent, or Firm*—Pollock, Vande Sande & Priddy

[57] ABSTRACT

A lead 20 protrudes from a main body 19a of a connector 18. A connector electrode 13 extends along a surface 10a of a printed circuit board 10. A solder paste 26, applied onto the connector electrode 13, is offset a predetermined distance inward from the edge of the printed circuit board 10. The lead 20 is shifted along the surface of connector electrode 13 inwardly from the edge of the printed circuit board 10 until a distal end 20a of the lead 20 is brought into contact with the solder paste 26. Then, the solder paste 26 is melted under the condition where the distal end 20a is brought into contact with the solder paste 26, thereby soldering the connector 18 on the printed circuit board 10.

15 Claims, 7 Drawing Sheets

METHOD OF SOLDERING AN ELECTRONIC CONNECTOR ON A PRINTED CIRCUIT BOARD

BACKGROUND OF THE INVENTION

1. Field of the Invention:

The present invention relates to a method of soldering an electronic connector on a printed circuit board and a related connector structure.

2. Prior Art:

In general, various electronic components or parts are mounted on a surface of a printed circuit board which is to be incorporated in various electronic apparatus. Among these electronic components or parts, connectors are characterized in that they are usually mounted on an end portion of a printed circuit board for realizing the required function of electrically connecting the printed circuit board to an external device. On the other hand, the surface mounting type electronic components or parts are generally mounted on either or both of the front and reverse surfaces of the printed circuit board.

A conventional method of soldering the connector will be explained hereinafter with reference to FIGS. 13 and 14. In FIG. 13, a printed circuit board 1 has printed circuit patterns formed on both a front surface A and a reverse surface B. An electrode 2 is formed on the front surface A and an electrode 3 is formed on the reverse surface B. A connector 6, which is to be coupled with and soldered on the printed circuit board 1, has a main body 5 of box shape, and a pair of leads 6 and 7 provided in parallel with each other and extending horizontally from one surface of the main body 5.

According to this conventional soldering method of the electronic connector, a worker holds the main body 5 of the connector 4 as shown in FIG. 1B, then pushes or forces the connector 4 in a direction of an arrow N1. With this sliding engagement of the connector 5 with the printed circuit board 1, the electrodes 2 and 3 formed on the upper and lower surfaces of the printed circuit board 1 are clamped by the leads 6 and 7 of the connector 1 and are accordingly brought into contact with these leads 6 and 7.

Subsequently, as shown in FIG. 14, the worker whose one hand holds a soldering iron 8 warmed up and the other hand holds a solder 9, melts a sufficient amount of the solder 9 on a contact portion between the lead 6 and the electrode 2 using the soldering iron 6, thereby soldering the lead 6 and the electrode 2.

There is already known an automatic mounting apparatus which is used for realizing an automatic mounting operation of electronic components onto the surface of the printed circuit board from the top of the printed circuit board according to the surface mounting method. However, as explained above, the mounting operation of an electronic connector is uncommon or unique since it is carried out from the side of the printed circuit board. Due to the difference of the above-described mounting directions between the surface mounting type electronic components and the electronic connectors, the conventional automatic mounting apparatus could not be used for mounting the connectors. In other words, an automatic mounting operation for connectors has not been realized yet. Thus, the mounting and soldering operation of connectors relies on manual operation of workers. As a matter of fact, when conducted by manual operation of workers, the mounting and soldering operations of the connector decreases productivity and requires much manpower.

SUMMARY OF THE INVENTION

Accordingly, in view of above-described problems encountered in the prior art, a principal object of the present invention is to provide a method of automatically mounting and soldering a connector on an end of a printed circuit board. Furthermore, a second object of the present invention is to provide a connector soldering method capable of providing a series of automatic soldering steps for soldering both the connector and a surface mounting type electronic component.

In order to accomplish this and other related objects, a first aspect of the present invention provides a method of soldering a connector on a printed circuit board, wherein a lead protrudes from a main body of the connector and a connector electrode extends along a surface of the printed circuit board inwardly from an edge of the printed circuit board, said method comprising the steps of: applying solder onto the connector electrode, said solder being offset a predetermined distance inward from the edge of the printed circuit board; sliding said lead along the connector electrode inwardly from the edge of the printed circuit board until a distal end of said lead is brought into contact with said solder; and melting said solder which is brought into contact with said lead, thereby soldering the connector on the printed circuit board.

In the above first aspect of the present invention, the solder applied on the connector electrode, being offset a predetermined distance inward from the edge of the printed circuit board, can be solder paste or precoat.

A second aspect of the present invention provides a method of soldering a connector on a printed circuit board, wherein first and second leads protrude in parallel with each other from a main body of the connector and connector electrodes extend along front and reverse surfaces of the printed circuit board inwardly from an edge of the printed circuit board, said method comprising the steps of: coating solder on a surface of the connector electrode extending along the reverse surface of the printed circuit board; applying solder onto the connector electrode extending along the front surface, being offset a predetermined distance inward from the edge of the printed circuit board; sliding said first lead along a surface of the connector electrode on the front surface and said second lead along a surface of the solder coated on the connector electrode on the reverse surface inwardly from the edge of the printed circuit board until a distal end of said first lead is brought into contact with said solder applied onto the connector electrode on the front surface; and melting both said solder applied on the connector electrode on the front surface and said solder coated on the connector electrode on the reverse surface under a condition where said distal end of the first lead is brought into contact with said solder applied on the connector electrode on the front surface, thereby soldering the connector on both front and reverse surfaces of the printed circuit board.

In the above second aspect of the present invention, it is preferable to further comprise steps of: applying solder paste on a surface of the connector electrode on the reverse surface before the connector is brought into contact with the printed circuit board; and melting the solder paste applied on the surface of the connector electrode on the reverse surface, thereby forming a solder coat on the connector electrode extending along the reverse surface.

A third aspect of the present invention provides a method of soldering a connector on a printed circuit board, wherein a lead protrudes from a main body of the connector and a connector electrode extends along a surface of the printed circuit board inwardly from an edge of the printed circuit board, said method comprising the steps of: applying solder onto the connector electrode, being offset a predetermined distance inward from the edge of the printed circuit board; applying solder onto surface mounting type electrodes, formed on the same surface as said connector electrode; placing a surface mounting type electronic component on said solder applied on said surface mounting type electrodes; sliding said lead along the connector electrode inwardly from the edge of the printed circuit board until a distal end of said lead is brought into contact with said solder on the connector electrode; and melting both said solder on the connector electrode and said solder on the surface mounting type electrodes under a condition where the distal end of the lead is brought into contact with said solder on the connector electrode, thereby soldering both the connector and the surface mounting type electronic component on the printed circuit board.

A fourth aspect of the present invention provides a method of soldering a connector on a printed circuit board, wherein first and second leads protrude in parallel with each other from a main body of the connector and connector electrodes extend along both surfaces of the printed circuit board inwardly from an edge of the printed circuit board, said method comprising the steps of: applying solder onto the connector electrode extending along one surface of the printed circuit board; applying solder onto surface mounting type electrodes formed on said one surface of the printed circuit board; placing a surface mounting type electronic component on the solder applied on the surface mounting type electrodes formed on said one surface of the printed circuit board; melting said solder applied on said one surface of the printed circuit board; applying solder onto the connector electrode formed on the other surface of said printed circuit board, being offset a predetermined distance inward from the edge of the printed circuit board; applying solder on surface mounting type electrodes formed on said the other surface of the printed circuit board; placing another surface mounting type electronic component oh the solder applied on the surface mounting type electrodes formed on said the other surface of the printed circuit board; sliding said first lead along a surface of the connector electrode on said the other surface and said second lead along a surface of the solder applied on the connector electrode on said one surface inwardly from the edge of the printed circuit board until a distal end of said first lead is brought into contact with said solder formed on said the other surface; and melting the solder paste applied on said the other surface of the printed circuit board, under a condition where the distal end of the first lead is brought into contact with said solder formed on the connector electrode on said the other surface, thereby soldering the connector on both surfaces of the printed circuit board.

In the preferable mode of the above-described connector soldering method, the distal end of the lead is bent to form a rising surface to be brought into contact with the solder paste. A curvature is formed at an intermediate portion of the lead to define a space for filling solder between the lead and the connector electrode. And, the connector electrode extending along the one surface of the printed circuit board is bifurcated to form a slit for guiding the second lead in a predetermined direction from the edge of the printed circuit board.

Moreover, a fifth aspect of the present invention provides an electronic connector comprising: a main body; a lead protruding from a surface of a main body, said lead being solderable onto a connector electrode formed on an end of a printed circuit board; a rising surface formed at a distal end of said lead for providing a surface to be brought into contact with solder; and a curvature formed at an intermediate portion of said lead to define a space for filling solder therein.

BRIEF DESCRIPTION OF THE DRAWINGS

The above and other objects, features and advantages of the present invention will become more apparent from the following detailed description which is to be read in conjunction with the accompanying drawings, in which.

DETAILED DESCRIPTION OF THE PREFERRED EMBODIMENTS

Figure 1:
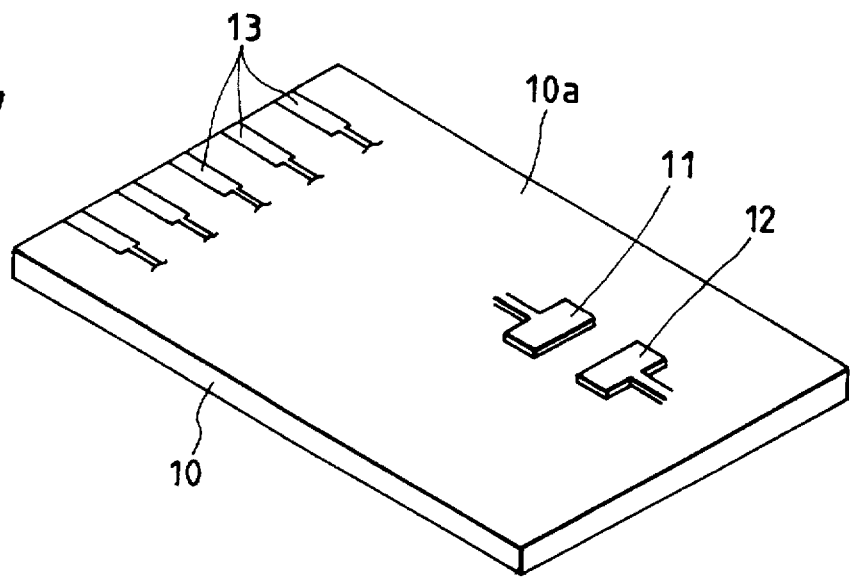
FIG. 1 is a perspective view showing a front surface (i.e. first surface) of a printed circuit board in accordance with a first embodiment of the present invention.

Preferred embodiments of the method for mounting a connector onto an end of the printed circuit board in accordance with the present invention will be explained in greater detail hereinafter, with reference to the accompanying drawings wherein the same reference numerals are applied to like parts.

Figure 2:
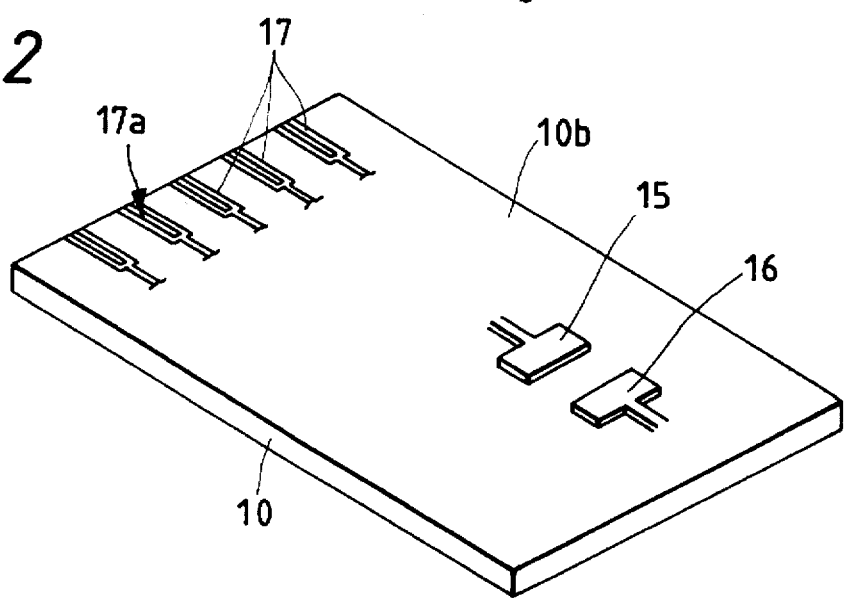
FIG. 2 is a perspective view showing a reverse surface (i.e. second surface) of the printed circuit board in accordance with the first embodiment of the present invention.

FIG. 1 is a perspective view showing a front surface (i.e. first surface) of a printed circuit board in accordance with a first embodiment of the present invention. FIG. 2 is a perspective view showing a reverse surface (i.e. second surface) of the printed circuit board in accordance with the first embodiment of the present invention.

Figure 3:
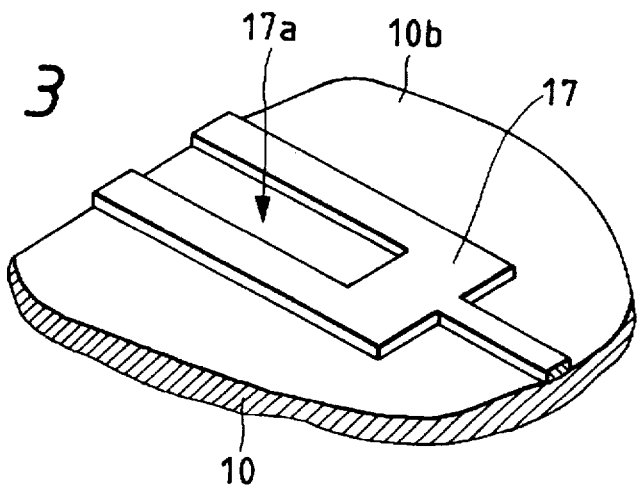
FIG. 3 is a partially enlarged perspective view showing details of the arrangement of a connector electrode of the printed circuit board in accordance with the first embodiment of the present invention.

As shown in FIG. 1, a printed circuit board 10 has a front surface 10a serving as the first surface. At the center of the front surface 10a, there are provided surface mounting type electrodes 11 and 12 to be connected to a surface mounting type electronic component, such as a chip, a mini-transistor, SOP, QFP, etc. Along the edge line of the front surface 10a, there is provided a row of plural connector electrodes 13—13 disposed in parallel to each other, each extending perpendicularly to the edge line of the printed circuit board 10 from the edge toward the center of the front surface 10a. These electrodes 13—13 are electrically connected to corresponding leads of a connector. Furthermore, as shown in FIG. 2, the printed circuit board 10 has a reverse surface 10b serving as the second surface. At the center of the reverse surface 10b, there are provided surface mounting type electrodes 15 and 16 similar to the electrodes 11 and 12. Along the edge line of the reverse surface 10b, there is provided a row of plural connector electrodes 17—17 disposed in parallel to each other, each extending perpendicularly to the edge line of the printed circuit board 10 from the edge toward the center of the reverse surface 10b. Each connector electrode 17 formed on the reverse surface 10b is in one-to-one relationship with a corresponding connector electrode 13 on the front surface 10a. In other words, the connector electrode 17 is provided just below the corresponding connector electrode 13. As shown in FIG. 3, each connector electrode 17 is bifurcated at the edge thereof so as to form a slit 17a extending perpendicularly to the edge line of the printed circuit board 10. This slit 17a serves as a guide for regulating the slide movement of a lead of the connector when the lead is shifted along the surface the connector electrode 17 coated by solder.

Figure 4:
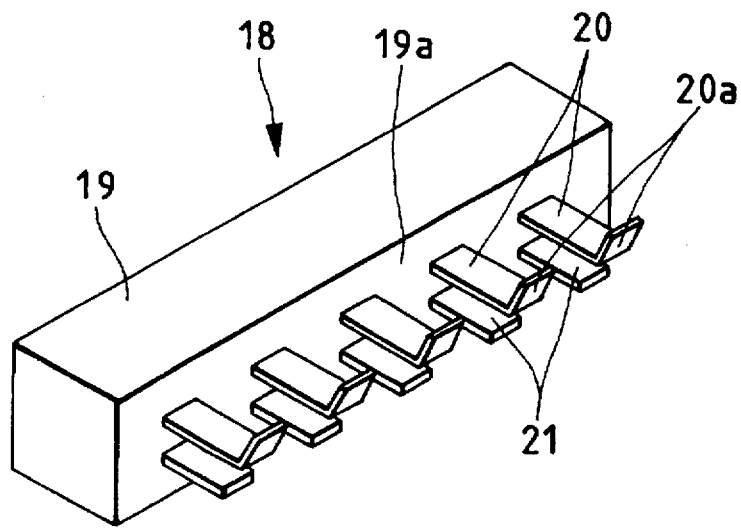
FIG. 4 is an enlarged perspective view showing details of the arrangement of a connector in accordance with the first embodiment of the present invention.

Next, the connector will be explained. As shown in FIG. 4, the connector 18 has a main body 19 of box shape which has a front surface 19a on which first leads 20—20 and second leads 21—21 are provided. The first leads 20—20 protrude forward horizontally at regular intervals from the upper front of the connector main body 19 so as to constitute an upper lead row, while the second leads 21—21 protrude forward horizontally at regular intervals from the lower front of the connector main body 19 so as to constitute a lower lead row. More specifically, the first leads 20—20 and the second leads 21—21 are disposed in parallel with each other, so that a clearance between the upper lead row and the lower lead row is substantially identical with the thickness of an edge of the printed circuit board 10 to be coupled or engaged with this connector 18. Each first lead 20 has a distal end 20a being bent upward to form a rising surface. With this rising surface, the distal end 20a of the first lead 20 is brought into contact with solder paste applied on the corresponding electrode 13.

Figure 5:
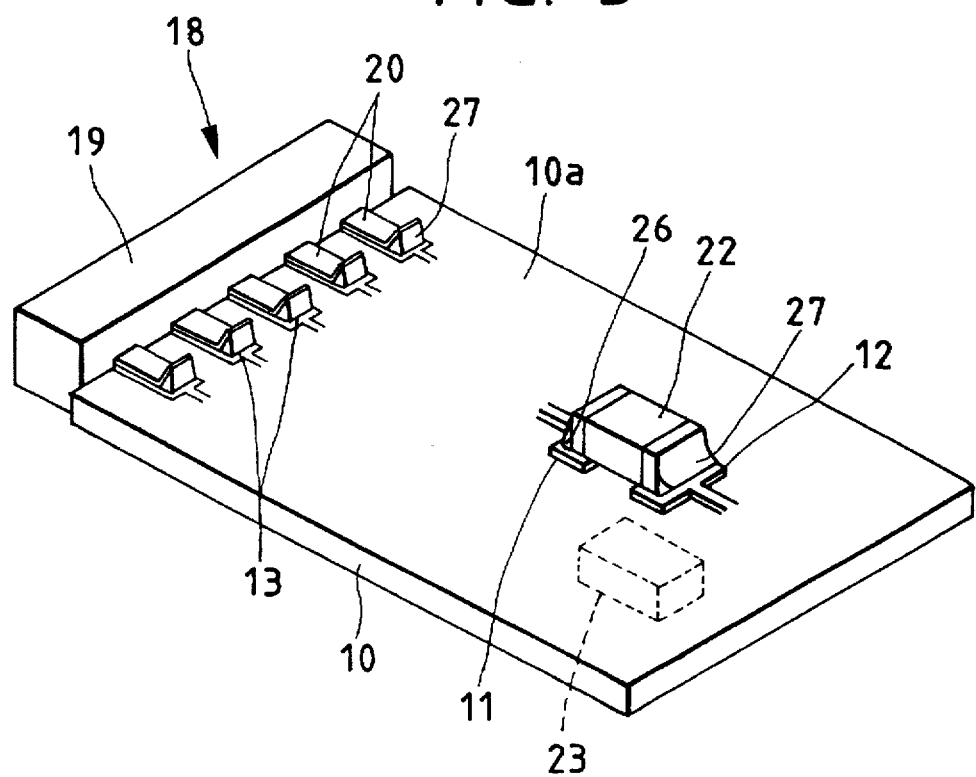
FIG. 5 is a perspective view showing the printed circuit board soldered with the connector and electronic components in accordance with the first embodiment of the present invention.

FIG. 5 is a perspective view showing the printed circuit board 10 soldered with the connector 18 and electronic components 22 and 23. More specifically, when the soldering operation is finished, the first leads 20—20 of the connector 18 are firmly fixed to their corresponding connector electrodes 13—13 on the front surface 10a by means of solder 27 hardened. Similarly, the second leads 21—21 of the connector 18 are firmly fixed to their corresponding connector electrodes 17—17 on the reverse surface 10b, although not shown in FIG. 5. Furthermore, the surface mounting type electronic component 22 is firmly fixed onto the surface mounting type electrodes 11 and 12 on the front surface 10a. The surface mounting type electronic component 23 is also fixed onto the surface mounting type electrodes 15 and 16 on the reverse surface 10b.

Figure 6A:
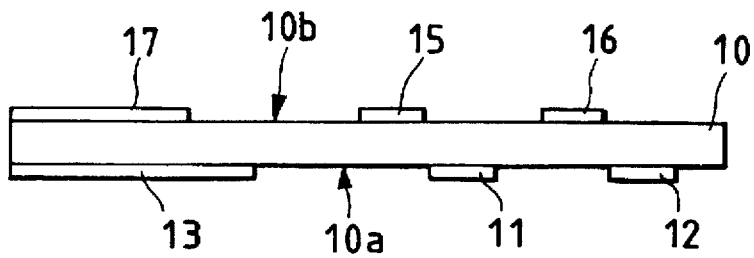
FIGS. 6A–6D are views illustrating a first half of a sequential soldering method for soldering the connector onto the printed circuit board in accordance with the first embodiment of the present invention.
Figure 6B:
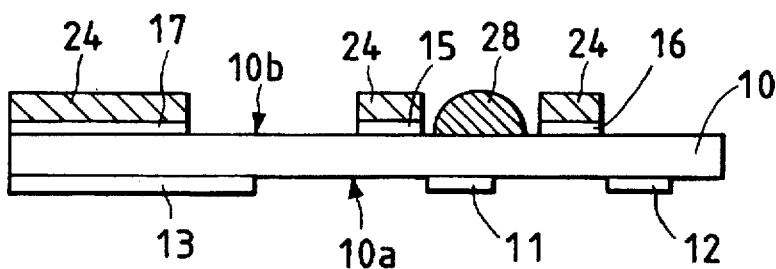

A method of the first embodiment of the present invention, i.e. a method of soldering the connector 18 on the printed circuit board 10, will be explained with reference to FIGS. 6A–6D and 7A–7D. First of all, as shown in FIG. 6A, the printed circuit board 10, placed upside down, is transported into an automatic soldering line. Then, as shown in FIG. 6B, solder pastes 24—24 are printed on the connector electrodes 17—17 and the surface mounting type electrodes 15, 16 using the screen printing apparatus. More specifically, a mask having pattern holes corresponding to the connector electrodes 17—17 and the surface mounting type electrodes 15, 16 is placed on the reverse surface 10b of the printed circuit board 10. Then, a squeegee is slid along the reverse surface 10b to coat or print the solder paste 24 on both the connector electrodes 17—17 and the surface mounting type electrodes and 16. Then, using a bond coating apparatus, an adhesive material 28 is provided at a predetermined place between the surface mounting type electrodes 15 and 16 on the reverse surface 10b.

Figure 6C:
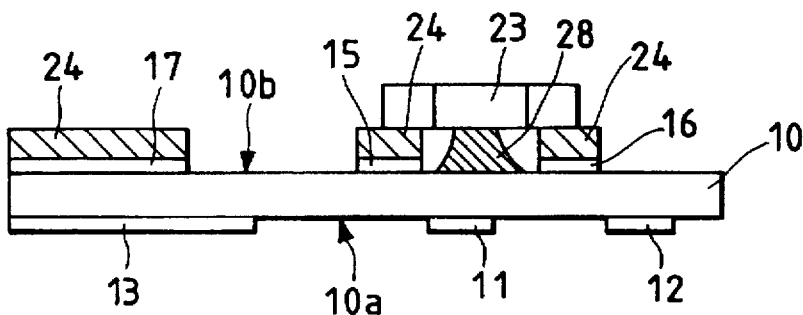
Figure 6D:
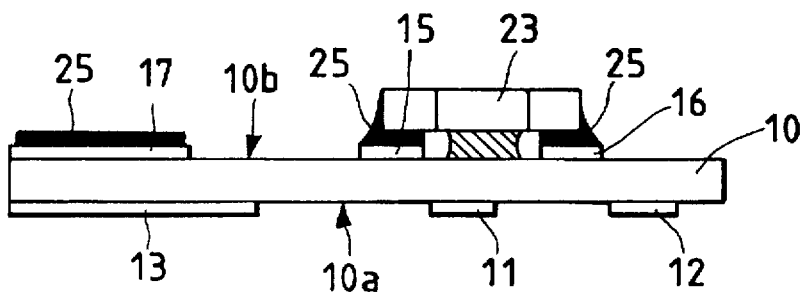

Subsequently, as shown in FIG. 6C, using an electronic component mounting apparatus, the surface mounting type electronic component 23 is placed on the solder pastes on the surface mounting type electrodes 15, 16, thereby bringing the lower surface of the surface mounting type electronic component 23 into contact with the adhesive material 28. Thereafter, the printed circuit board 10 is entered into a reflow apparatus for adding heat. With application of heat, the solder pastes 24—24 are melted to form fillets. And then, the molten solder pastes 24—24 are cooled down to form hardened solders 25—25 as shown in FIG. 6D, thereby completing the soldering operation of the surface mounting type electronic component 23 onto the surface mounting type electrodes 15, 16 on the reverse surface 10b. At this moment, the solder paste 24 on the connector electrode 17 is also hardened to form a solder coat on each connector electrode 17.

Figure 7A:
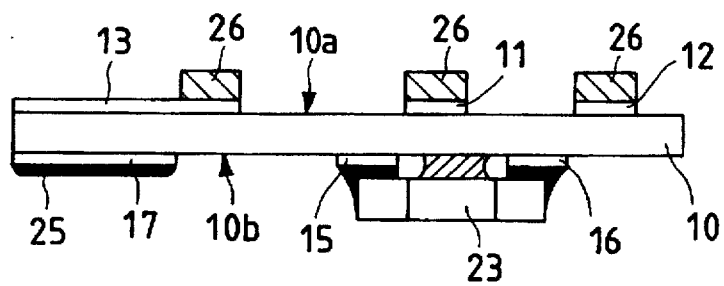
FIGS. 7A–7D are views illustrating a second half of the sequential soldering method for soldering the connector onto the printed circuit board in accordance with the first embodiment of the present invention.

Next, the printed circuit board 10 is reversed to place the front surface 10a up as shown in FIG. 7A. Using the screen printing apparatus again, solder pastes 26—26 are printed on both the connector electrodes 13—13 and the surface mounting type electrodes 11, 12. The solder paste 26 formed on the connector electrode 13 is offset a predetermined distance inward from the edge of the printed circuit board 10. The above offset distance of the solder paste 26 on the connector electrode 13 just corresponds to the length of the first lead 20 of the connector 18.

Figure 7B:
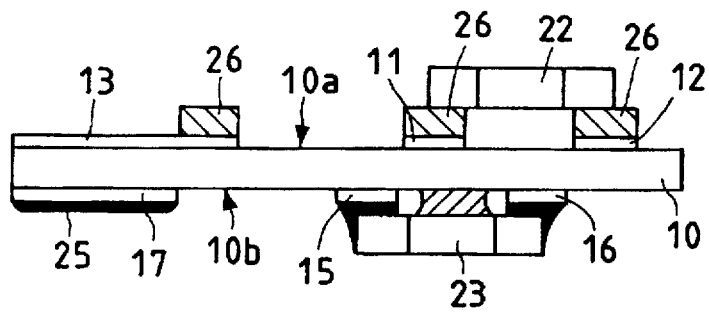
Figure 8:
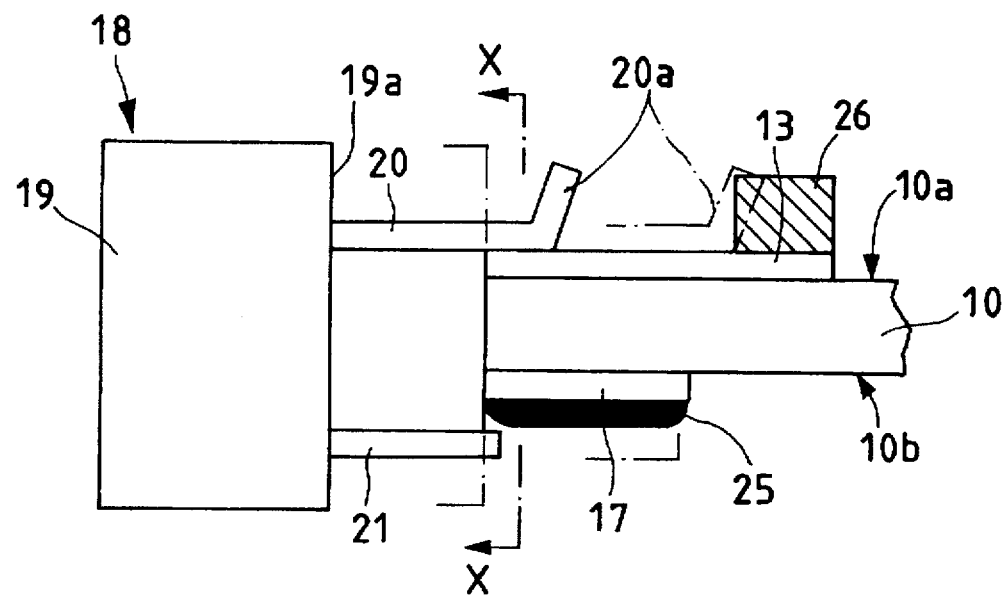
FIG. 8 is a view illustrating one step of the connector soldering method in accordance with the first embodiment of the present invention.
Figure 9:
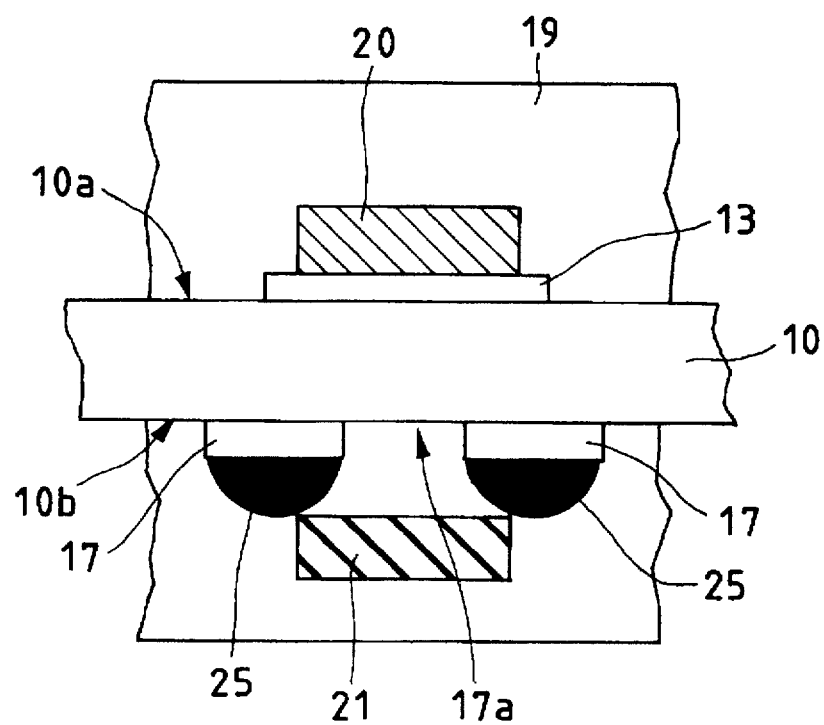
FIG. 9 is a cross-sectional view taken along a line X—X of FIG. 8.

Subsequently, as shown in FIG. 7B, using the electronic component mounting apparatus, the surface mounting type electronic component 22 is placed on the solder pastes 26, 26 on the surface mounting type electrodes 11, 12. For this surface mounting type electronic component 22, no adhesive material is necessary. Then, as shown in FIG. 8, the connector 18 is coupled or engaged with the printed circuit board 10 from the edge of the printed circuit board 10, so that the first leads 20—20 slide along the front surface 10a while the second leads 21—21 slide along the reverse surface 10b. More specifically, as shown in FIG. 9, each of the first leads 20—20 slides on the surface of a corresponding connector electrode 13 perpendicularly to the edge line of the printed circuit board 10 while each of the seconds leads 21—21 slides along the slit 17a formed between the hardened solders 25, 25 on the bifurcated electrodes 17, 17.

Figure 10:
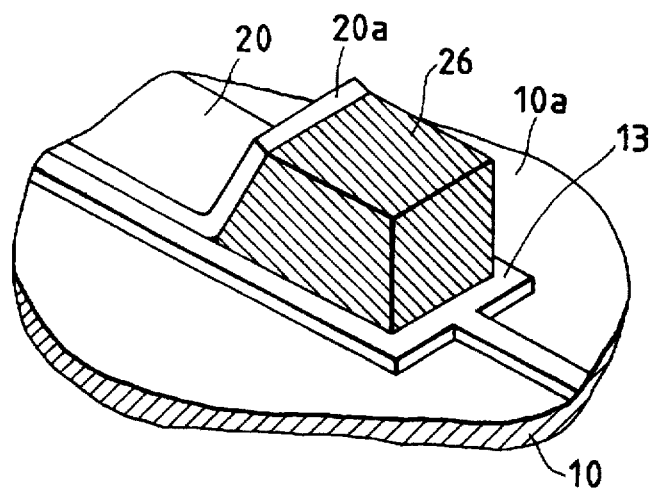
FIG. 10 is a partially enlarged perspective view showing details of the soldering arrangement of the lead and the connector electrode in accordance with the first embodiment of the present invention.

Namely, by the guide function of the slit 17a, the second lead 21 bridging the hardened solders 25, 25 slides in the longitudinal direction of the slit 17a. When the front surface 19a of the main body 19 abuts the edge of the printed circuit board 10 as shown by an alternate long and short dash line in FIG. 8, the distal end 20a of the first lead 20 is brought into contact with the solder paste 26 printed on the connector electrode 13. (Refer to FIGS. 7C and 10)

Figure 7C:
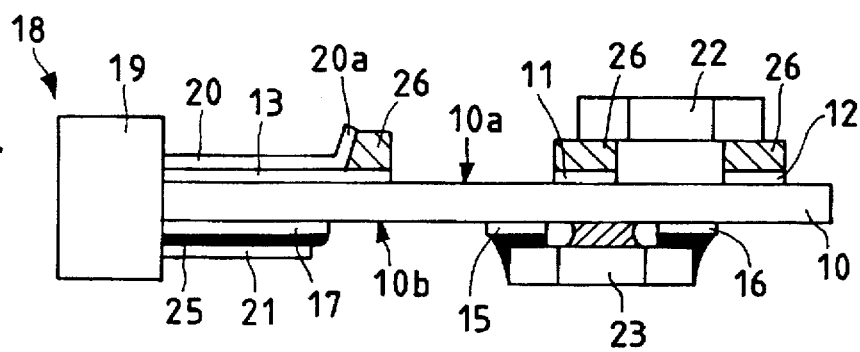
Figure 7D:
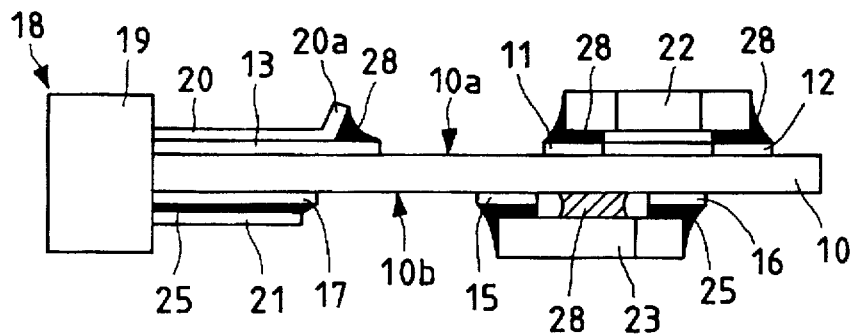

Keeping the assembled condition of FIG. 7C, the printed circuit board 10 is again entered into the reflow apparatus to melt the solder pastes 26—26. Thereafter, the molten solder pastes 26—26 are cooled down to form hardened solders 28—28 as shown in FIG. 7D, thereby completing the soldering operation of both the surface mounting type electronic component 22 onto the surface mounting type electrodes 11, 12 and the first lead 20 onto the connector electrode 13. Meanwhile, the solder 25 coated on the connector electrode 17 extending along the reverse surface 10b is once melted and hardened later, thereby soldering the second lead 21 onto the connector electrode 17. In the condition of FIG. 7D, the adhesive material 28 acts to securely hold the surface mounting type electronic component 23, so that the surface mounting type electronic component 23 is surely prevented from falling off the electrodes 15, 16 when the solders 25, 25 are melted again.

Figure 11:
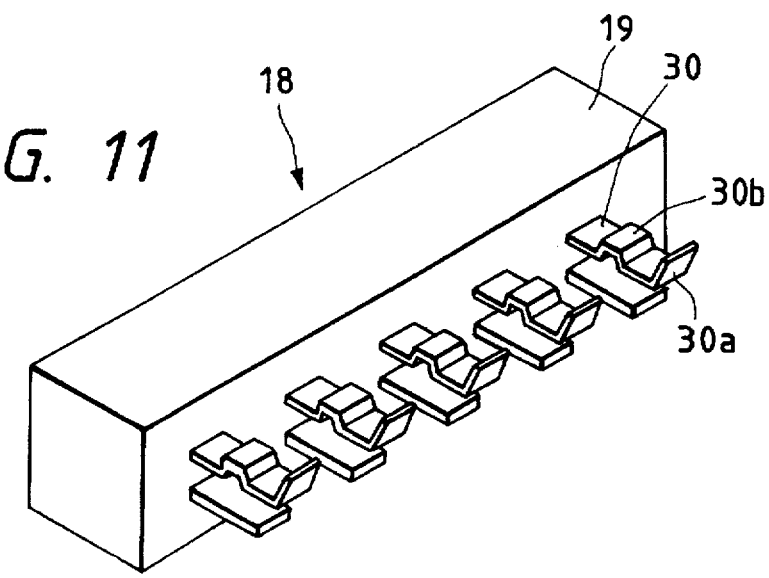
FIG. 11 is a perspective view showing a connector in accordance with a second embodiment of the present invention.
Figure 12:
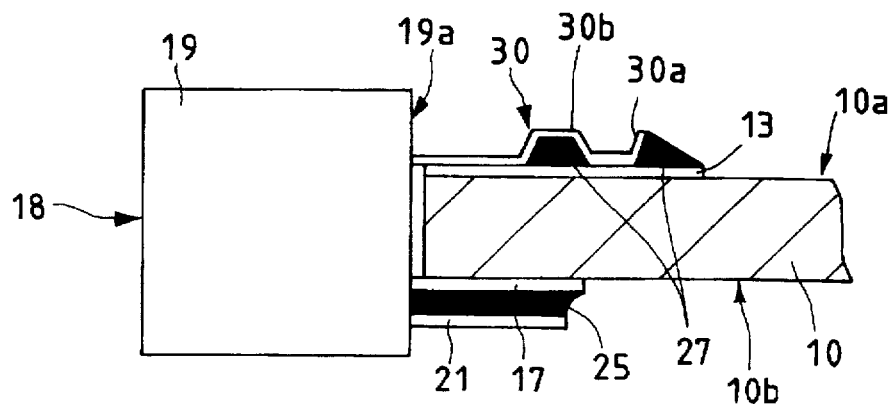
FIG. 12 is a view illustrating a step of soldering the connector on a printed circuit board in accordance with the second embodiment of the present invention.
Figure 13:
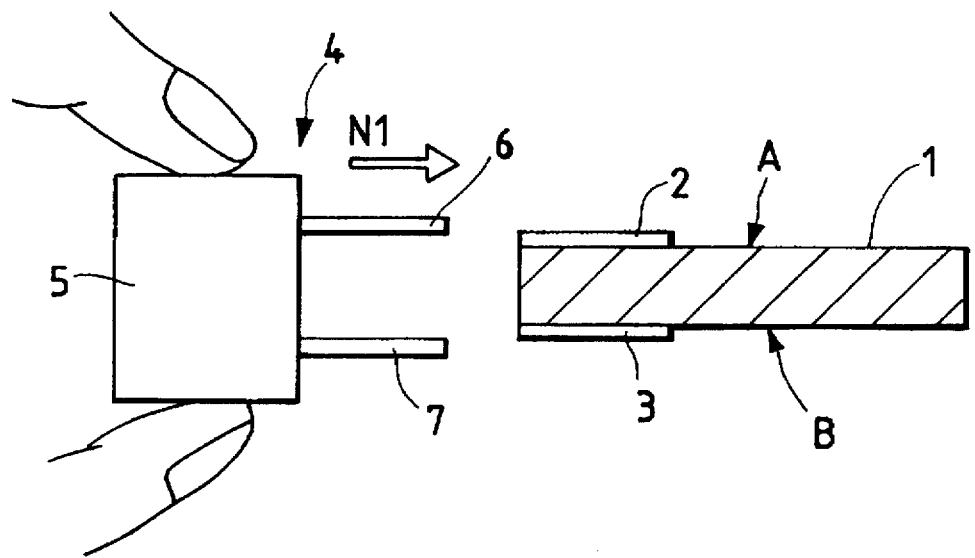
FIG. 13 is a view illustrating a step of a conventional connector soldering method.
Figure 14:
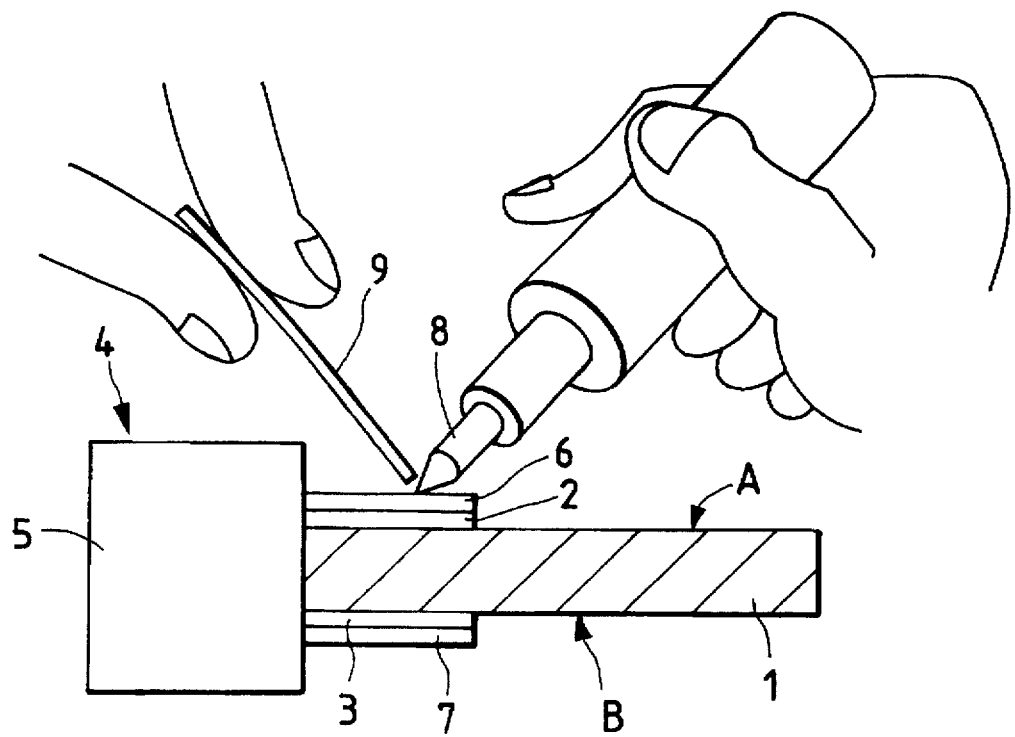
FIG. 14 is a view illustrating a step of a conventional connector soldering method.

FIG. 11 is a perspective view showing a connector in accordance with a second embodiment of the present invention. FIG. 12 is a view illustrating a step of soldering the connector on the printed circuit board in accordance with the second embodiment of the present invention. The second embodiment is different from the first embodiment by the configuration of the first lead. More specifically, as shown in FIG. 11, each of first leads 30—30 has a curvature 30b in addition to a bent distal end 30b. The configuration of the distal end 30a is substantially the same as the distal end 20a of the first embodiment. The curvature 30b is formed at the intermediate portion between the distal end 30a and the base end of the first lead 30. The configuration of the curvature 30b is like a reversed U shape which defines a space for filling solder between the first lead 30 and a flat connector electrode 13. With this arrangement, molten solder enters into the space defined by the curvature 30b. Thus, the first lead 30 is firmly fixed to the connector electrode 13 at the portions of the distal end 30a and the curvature 30b by means of the solders 27, 27 which are later hardened. The mounting and soldering method of the second embodiment is the same as that of the first embodiment, and therefore will not be explained again.

Although the solder paste is printed using the screen printing apparatus in the above embodiments, it is needless to say that the solder paste can be applied onto the electrode using other device such as a dispensing apparatus. Furthermore, the solder paste of the present invention can be replaced by precoat solder.

As this invention may be embodied in several forms without departing from the spirit of essential characteristics thereof, the present embodiments as described are therefore intended to be only illustrative and not restrictive, since the scope of the invention is defined by the appended claims rather than by the description preceding them, and all changes that fall within metes and bounds of the claims, or equivalents of such metes and bounds, are therefore intended to be embraced by the claims.

What is claimed is:

1. A method of soldering a connector on a printed circuit board, wherein said connector has a lead and a protrusion both extending from a main body of said connector in parallel to each other, and a connector electrode extends along a surface of the printed circuit board inwardly from an edge of the printed circuit board, said method comprising the steps of:

applying solder onto the connector electrode, said solder being offset a predetermined distance inward from the edge of said printed circuit board;

engaging said connector with said printed circuit board by sliding said lead along the connector electrode inwardly from the edge of the printed circuit board, while sandwiching said printed circuit board between said lead and said protrusion of said connector, until a distal end of said lead is brought into contact with said solder; and melting said solder which is brought into contact with said lead, thereby soldering the connector on the printed circuit board.

2. The connector soldering method in accordance with claim 1, wherein said distal end of the lead is bent to form a rising surface to be brought into contact with said solder.

3. The connector soldering method in accordance with claim 1, wherein a curvature is formed at an intermediate portion of said lead to define a space for filling solder between the lead and the connector electrode.

4. A method of soldering a connector on a printed circuit board, wherein first and second leads protrude in parallel with each other from a main body of the connector and connector electrodes extend along front and reverse surfaces of the printed circuit board inwardly from an edge of the printed circuit board, said method comprising the steps of:

coating solder on a surface of the connector electrode extending along the reverse surface of the printed circuit board;

applying solder onto the connector electrode extending along the front surface, being offset a predetermined distance inward from the edge of the printed circuit board;

sliding said first lead along a surface of the connector electrode on the front surface and said second lead along a surface of the solder coated on the connector electrode on the reverse surface inwardly from the edge of the printed circuit board until a distal end of said first lead is brought into contact with said solder applied onto the connector electrode on the front surface; and melting both said solder applied on the connector electrode on the front surface and said solder coated on the connector electrode on the reverse surface under a condition where said distal end of the first lead is brought into contact with said solder applied on the connector electrode on the front surface, thereby soldering the connector on both front and reverse surfaces of the printed circuit board.

5. The connector soldering method in accordance with claim 4, wherein said distal end of the first lead is bent to form a rising surface to be brought into contact with said solder applied on the connector electrode on the front surface.

6. The connector soldering method in accordance with claim 4, wherein a curvature is formed at an intermediate portion of said first lead to define a space for filling solder between the first lead and the connector electrode on the front surface.

7. The connector soldering method in accordance with claim 4, further comprises steps of:

applying solder onto a surface of said connector electrode on the reverse surface before said connector is brought into contact with the printed circuit board; and melting said solder applied on the surface of said connector electrode on the reverse surface, thereby forming a solder coat on said connector electrode extending along the reverse surface.

8. The connector soldering method in accordance with claim 4, wherein said connector electrode extending along the reverse surface is bifurcated to form a slit for guiding said second lead in a predetermined direction from the edge of said printed circuit board.

9. A method of soldering a connector on a printed circuit board, wherein said connector has a lead and a protrusion both extending from a main body of said connector in parallel to each other, and a connector electrode extends along a surface of the printed circuit board inwardly from an edge of the printed circuit board, said method comprising the steps of:

applying solder onto the connector electrode, being offset a predetermined distance inward from the edge of the printed circuit board;

applying solder onto surface mounting type electrodes, formed on the same surface as said connector electrode;

placing a surface mounting type electronic component on said solder applied on said surface mounting type electrodes;

engaging said connector with said printed circuit board by sliding said lead along the connector electrode inwardly from the edge of the printed circuit board, while sandwiching said printed circuit board between said lead and said protrusion of said connector, until a distal end of said lead is brought into contact with said solder on the connector electrode; and melting both said solder on the connector electrode and said solder on the surface mounting type electrodes under a condition where the distal end of the lead is brought into contact with said solder on the connector electrode, thereby soldering both the connector and the surface mounting type electronic component on the printed circuit board.

10. The connector soldering method in accordance with claim 9, wherein said distal end of the lead is bent to form a rising surface to be brought into contact with said solder on the connector electrode.

11. The connector soldering method in accordance with claim 9, wherein a curvature is formed at an intermediate portion of said lead to define a space for filling solder between the lead and the connector electrode.

12. A method of soldering a connector on a printed circuit board, wherein first and second leads protrude in parallel with each other from a main body of the connector and connector electrodes extending along both surfaces of the printed circuit board inwardly from an edge of the printed circuit board, said method comprising the steps of:

applying solder onto the connector electrode extending along one surface of the printed circuit board;

applying solder onto surface mounting type electrodes formed on said one surface of the printed circuit board;

placing a surface mounting type electronic component on the solder applied on the surface mounting type electrodes formed on said one surface of the printed circuit board;

melting said solder applied on said one surface of the printed circuit board;

applying solder onto the connector electrode formed on the other surface of said printed circuit board, being offset a predetermined distance inward from the edge of the printed circuit board;

applying solder on surface mounting type electrodes formed on said other surface of the printed circuit board;

placing another surface mounting type electronic component on the solder applied on the surface mounting type electrodes formed on said other surface of the printed circuit board;

engaging said connector with said printed circuit board by sliding said first lead along a surface of the connector electrode on said other surface and sliding said second lead along a surface of the solder applied on the connector electrode on said one surface inwardly from the edge of the printed circuit board, while sandwiching said printed circuit board between said first and second leads, until a distal end of said first lead is brought into contact with said solder formed on said other surface; and melting the solder applied on said other surface of the printed circuit board, under a condition where the distal end of the first lead is brought into contact with said solder formed on the connector electrode on said other surface, thereby soldering the connector on both surfaces of the printed circuit board.

13. The connector soldering method in accordance with claim 12, wherein said distal end of the first lead is bent to form a rising surface to be brought into contact with the solder formed on the connector electrode on said the other surface.

14. The connector soldering method in accordance with claim 12, wherein a curvature is formed at an intermediate portion of said first lead to define a space for filling solder between the first lead and the connector electrode on said the other surface.

15. The connector soldering method in accordance with claim 12, wherein said connector electrode extending along said one surface is bifurcated to form a slit for guiding said second lead in a predetermined direction from the edge of said printed circuit board.

\* \* \* \* \*